US010211833B2

(12) United States Patent
Tang

(10) Patent No.: US 10,211,833 B2
(45) Date of Patent: Feb. 19, 2019

(54) TECHNIQUES FOR POWER CONTROL OF CIRCUIT BLOCKS

(71) Applicant: Altera Corporation, San Jose, CA (US)

(72) Inventor: Lai Guan Tang, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 205 days.

(21) Appl. No.: 15/270,534

(22) Filed: Sep. 20, 2016

(65) Prior Publication Data
US 2018/0083626 A1  Mar. 22, 2018

(51) Int. Cl.
*H03K 19/00* (2006.01)
(52) U.S. Cl.
CPC ................. *H03K 19/0016* (2013.01)
(58) Field of Classification Search
CPC .................................................. H03K 19/0016
USPC ...................... 327/543, 538, 419; 326/41, 44
See application file for complete search history.

(56) References Cited

U.S. PATENT DOCUMENTS

| 7,236,010 B1* | 6/2007 | Keith | H03K 19/17728 326/41 |
|---|---|---|---|
| 7,284,137 B2 | 10/2007 | Clark et al. | |
| 7,498,839 B1* | 3/2009 | Jenkins, IV | H03K 19/17748 257/207 |
| 9,059,696 B1* | 6/2015 | Rahman | H03K 19/0013 |
| 2010/0194470 A1 | 8/2010 | Monchiero et al. | |
| 2012/0326772 A1* | 12/2012 | Myers | H03K 19/0016 327/543 |
| 2013/0015904 A1* | 1/2013 | Priel | G06F 1/3203 327/419 |
| 2014/0043072 A1 | 2/2014 | Minakawa | |
| 2016/0118988 A1 | 4/2016 | Sood et al. | |

OTHER PUBLICATIONS

Korean Intellectual Property Office, International Search Report for international application PCT/US2017/050224, dated Dec. 15, 2017, pp. 1-3.
Korean Intellectual Property Office, Written Opinion of the International Searching Authority for international application, PCT/US2017/050224, dated Dec. 15, 2017, pp. 1-7.

* cited by examiner

*Primary Examiner* — Thomas Skibinski
(74) *Attorney, Agent, or Firm* — Steven J. Cahill

(57) ABSTRACT

An integrated circuit includes a circuit block, a storage circuit that stores a static power gating control signal, a logic gate circuit that receives a dynamic power gating control signal and the static power gating control signal from the storage circuit, and a transistor coupled between the circuit block and a supply node at a supply voltage. A conductive state of the transistor is determined by an output signal of the logic gate circuit. The transistor is turned off to provide power gating to the circuit block in response to a change in the output signal of the logic gate circuit that is caused by the static power gating control signal or by the dynamic power gating control signal.

20 Claims, 5 Drawing Sheets

_(10)_

TECHNIQUES FOR POWER CONTROL OF CIRCUIT BLOCKS

FIELD OF THE DISCLOSURE

The present disclosure relates to electronic circuits, and more particularly, to techniques for power gating and isolating circuit blocks.

BACKGROUND

Integrated circuits often include many circuit blocks. For example, a programmable logic integrated circuit may include programmable logic array blocks, digital signal processing blocks, memory blocks, transceiver circuit blocks, to name a few examples. Each of these circuit blocks may consume power during operations performed by the integrated circuit.

BRIEF SUMMARY

According to some embodiments, an integrated circuit includes a circuit block, a storage circuit that stores a static power gating control signal, a logic gate circuit that receives the static power gating control signal from the storage circuit and a dynamic power gating control signal, and a transistor coupled between the circuit block and a supply node at a supply voltage. A conductive state of the transistor is determined by an output signal of the logic gate circuit. The transistor is turned off to provide power gating to the circuit block in response to a change in the output signal of the logic gate circuit that is caused by the static power gating control signal or by the dynamic power gating control signal.

Embodiments of the present invention can be implemented in numerous ways, such as a process, an apparatus, a system, or a device. Various objects, features, and advantages of the present invention will become apparent upon consideration of the following detailed description and the accompanying drawings.

DETAILED DESCRIPTION

During some operations performed by an integrated circuit (IC), some circuit blocks in the IC may not be used. Unused circuit blocks may continue to leak current during the operation of the IC, which increases the total power consumption of the IC. According to some embodiments disclosed herein, a power gating circuit is provided for a circuit block in an integrated circuit. The power gating circuit associated with the circuit block may be programmed to couple the circuit block to or decouple the circuit block from a supply voltage. An isolation circuit may also be provided for the circuit block. The isolation circuit can drive an output signal of the circuit block to a predefined logic state when the circuit block is decoupled from the supply voltage. The power gating and isolation circuits can reduce leakage current and power consumption when the circuit block is not being used. An IC may, for example, have a power gating circuit and an isolation circuit for each circuit block in a set of circuit blocks in the IC.

Figure 1:
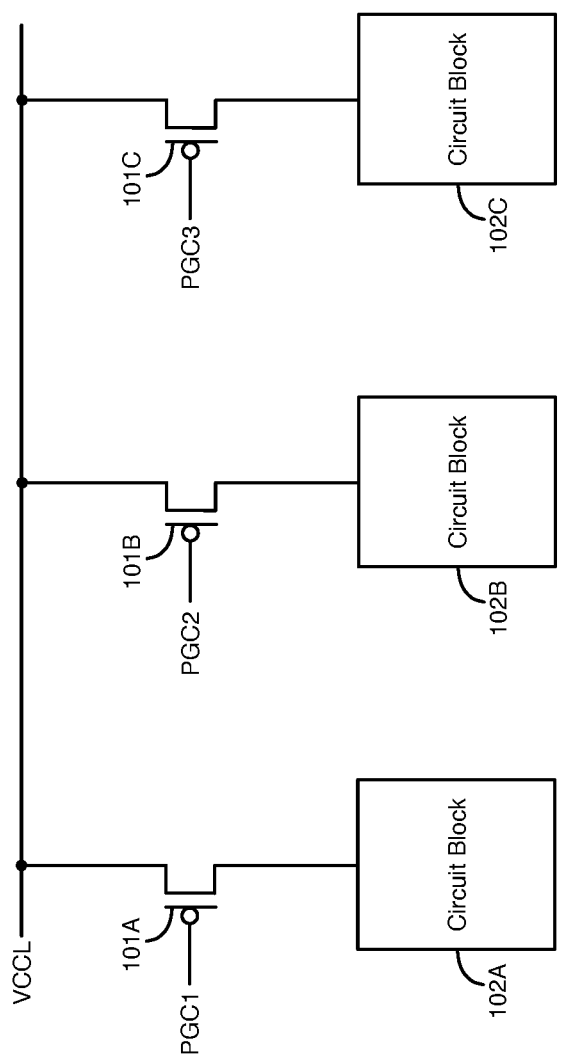
FIG. 1 illustrates an example of power gating circuits for a set of circuit blocks in an integrated circuit (IC), according to an embodiment.

FIG. 1 illustrates an example of power gating circuits for a set of circuit blocks in an integrated circuit, according to an embodiment. Figure (FIG. 1 shows power gating circuits 101 and circuit blocks 102 in an integrated circuit. The integrated circuit (IC) may be any type of IC, such as a programmable logic IC or a microprocessor IC. FIG. 1 shows three power gating circuits 101A, 101B, and 101C and three circuit blocks 102A, 102B, and 102C as an example. According to other embodiments, an integrated circuit may include any number of power gating circuits 101 and a corresponding number of circuit blocks 102. Each of the power gating circuits 101 is coupled to a respective one of the circuit blocks 102. For example, power gating circuits 101A, 101B, and 101C are coupled to circuit blocks 102A, 102B, and 102C, respectively.

Circuit blocks 102, including circuit blocks 102A-102C, may be any types of circuit blocks. For example, circuit blocks 102 may be digital signal processing (DSP) circuit blocks that perform arithmetic functions, programmable logic array circuit blocks, memory circuit blocks, processor circuit blocks (e.g., ARM processing blocks), controller circuit blocks, or transceiver circuit blocks. According to various embodiments, circuit blocks 102A-102C may be the same type of circuit block (e.g., all DSP blocks) or different types of circuit blocks (e.g., a DSP block, a processor block, and a programmable logic array block).

In the embodiment of FIG. 1, each of the power gating circuits 101 is a p-channel field-effect transistor (PFET). The source of each PFET 101 is coupled to a supply voltage node that is driven to a supply voltage VCCL during the operation of the IC. The drain of each PFET 101 is coupled to a respective one of the circuit blocks 102. For example, the drains of PFETs 101A-101C are coupled to circuit blocks 102A-102C, respectively. In other embodiments, each power gating circuit 101 may be an n-channel field-effect transistor or a bipolar junction transistor.

The gate of each PFET 101 is coupled to receive a power gating control signal. For example, the gates of power gating PFET circuits 101A, 101B, and 101C are coupled to receive power gating control signals PGC1, PGC2, and PGC3, respectively. The power gating control signals PGC control the conductive states of power gating PFET circuits 101. As such, the power gating control signals PGC determine which of the circuit blocks 102 receive current from the supply voltage node at supply voltage VCCL.

Each of the circuit blocks 102 receives current from supply voltage VCCL through a respective power gating PFET circuit 101 when the respective power gating control signal PGC causes that power gating PFET 101 circuit to be on. Current provided to each circuit block 102 from the supply voltage node at VCCL drives the operation of that circuit block 102. When any of the power gating control signals PGC causes a respective power gating PFET 101 to be off, current to the respective one of the circuit blocks 102 is blocked, and as a result, that circuit block 102 is powered down and does not draw current or consume power. Thus, the power gating PFET 101 associated with each circuit block 102 may be programmed by a power gating control signal PSG to couple the circuit block 102 to or to decouple the circuit block 102 from the supply voltage node at supply voltage VCCL.

If any of the circuit blocks 102 in the IC are not used at any time during operation of the IC, the respective power gating control signals PGC are set to logic high states to cause the respective power gating PFETs 101 to be off to block current to the respective unused circuit blocks 102 from the power supply node at VCCL. These unused circuit blocks 102 do not draw current from the supply voltage node at VCCL. For example, power control signal PGC1 may be set to a logic high state to cause PFET 101A to be off, blocking current from VCCL to circuit block 102A. In some embodiments, the unused circuit blocks 102 do not consume power while their respective power gating PFETs 101 are off, if these circuit blocks 102 do not receive current from another supply voltage.

When circuit blocks 102 in the IC are used during operation of the IC, the respective power gating control signals PGC are set to logic low states to cause the respective power gating PFETs 101 to be on to provide current from the power supply node at VCCL to the respective circuit blocks 102. As an example, power control signals PGC2-PGC3 may be set to logic low states to cause PFETs 101B-101C to be on to provide current from supply voltage VCCL to circuit blocks 102B-102C, respectively.

In an embodiment, a static power gating technique may be used to gate circuit blocks 102. Static power gating may be programmable by software through configuration memory circuits that store static power gating control signals. One dedicated configuration memory circuit may be assigned to each PFET 101. The static power gating signals are provided from the configuration memory circuits to the gates of the PFETs 101. The configuration memory circuits receive a power supply voltage that is different than VCCL and that is on a separate power supply node or line. The configuration memory circuits provide programmability for power gating the circuit blocks 102.

In another embodiment, a dynamic power gating technique may be used to bypass the static power configuration memory circuits. In this embodiment, the configuration memory circuits used for static power gating may be set by default to disable power gating of the circuit blocks 102. The dynamic power gating technique uses a separate dynamic power gating signal for each circuit block 102. The dynamic power gating signal can be set to block current from the supply voltage to the respective circuit block 102, even if the static power gating signal is not set to gate that circuit block 102. Further details of an embodiment that includes static and dynamic power gating techniques are shown in and described herein with respect to FIG. 2.

Figure 2:
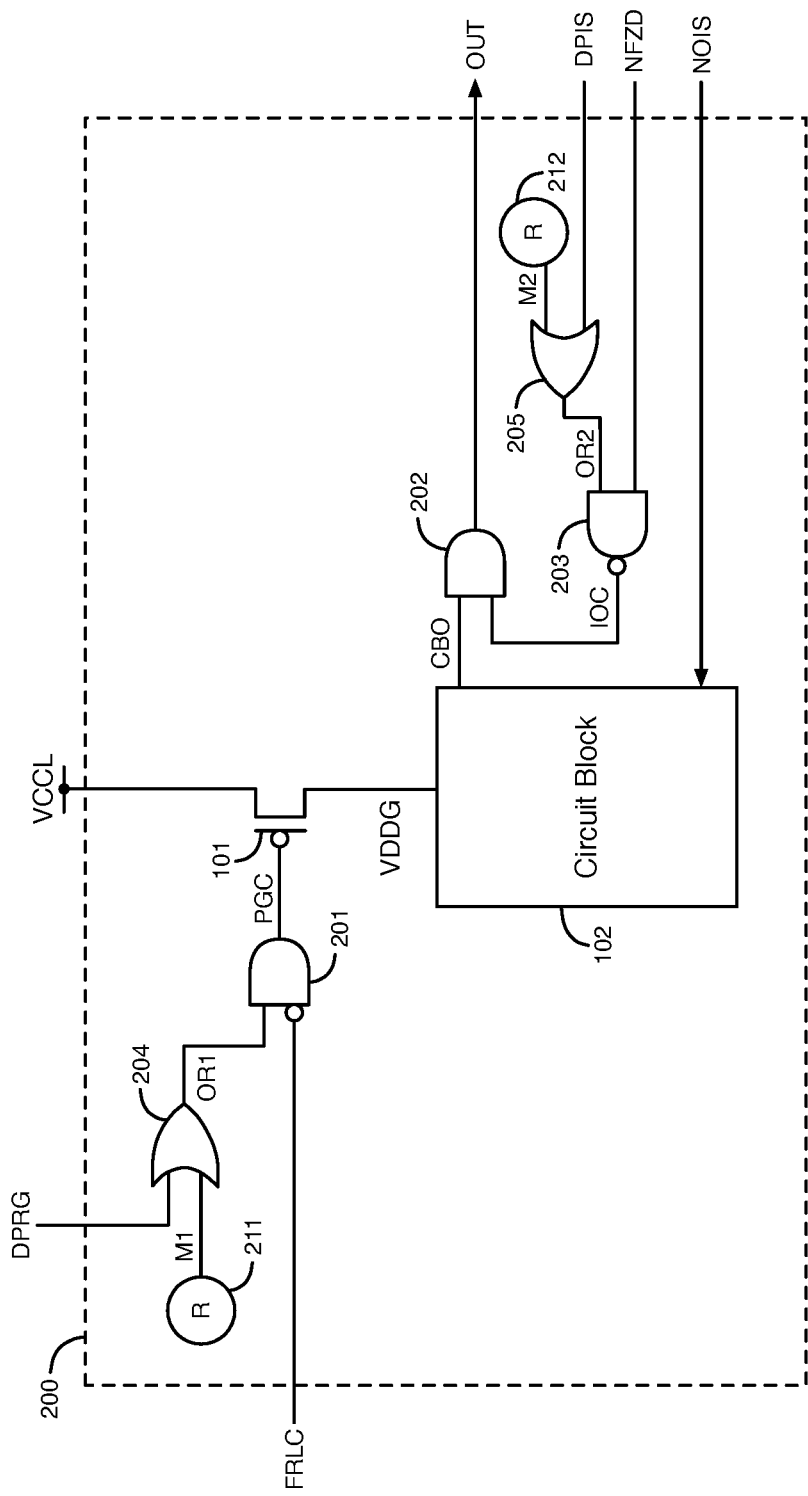
FIG. 2 illustrates an example of a wrapper circuit that provides programmable power gating and isolation for a circuit block, according to an embodiment.

FIG. 2 illustrates an example of a wrapper circuit 200 that provides programmable power gating and isolation for a circuit block 102, according to an embodiment. The wrapper circuit 200 of FIG. 2 includes PFET 101, AND logic gate circuits 201-202, NAND logic gate circuit 203, OR logic gate circuits 204-205, and storage circuits 211-212. Storage circuits 211-212 may be, for example, configuration memory circuits, such as random access memory circuits that are used for configuration of programmable circuits. As another example, storage circuits 211-212 may be registers, such as flip-flops. The wrapper circuit 200 is coupled to a circuit block 102 as shown in FIG. 2. Circuit block 102 may be any type of circuit block, as described above with respect to FIG. 1.

Wrapper circuit 200 shown in FIG. 2 may be in any type of IC, such as a programmable logic IC or a microprocessor IC. The IC may include numerous wrapper circuits 200 and numerous circuit blocks 102. The IC may, for example, have a wrapper circuit 200 coupled to each circuit block 102 in the IC. As another example, the IC may have wrapper circuits 200 coupled to only a subset of the circuit blocks 102 in the IC.

Wrapper circuit 200 includes a power gating circuit and an isolation circuit. The power gating circuit in wrapper circuit 200 includes AND logic gate circuit 201, OR logic gate circuit 204, storage circuit 211, and PFET 101. The power gating circuit in wrapper circuit 200 controls when the circuit block 102 receives current from the supply voltage node at supply voltage VCCL. The power gating circuit in wrapper circuit 200 can turn off PFET 101 to block current from the supply voltage node at VCCL to circuit block 102 to reduce leakage current and power consumption when circuit block 102 is not being used, as described above with respect to FIG. 1.

The isolation circuit in wrapper circuit 200 includes AND logic gate circuit 202, NAND logic gate circuit 203, OR logic gate circuit 205, and storage circuit 212. The isolation circuit in wrapper circuit 200 can drive an output signal OUT of circuit block 102 to a predefined logic state when the circuit block 102 is not being used to further reduce leakage current and power consumption. Further details of the operation of the power gating circuit and the isolation circuit in wrapper circuit 200 are described below with respect to FIG. 3.

Figure 3:
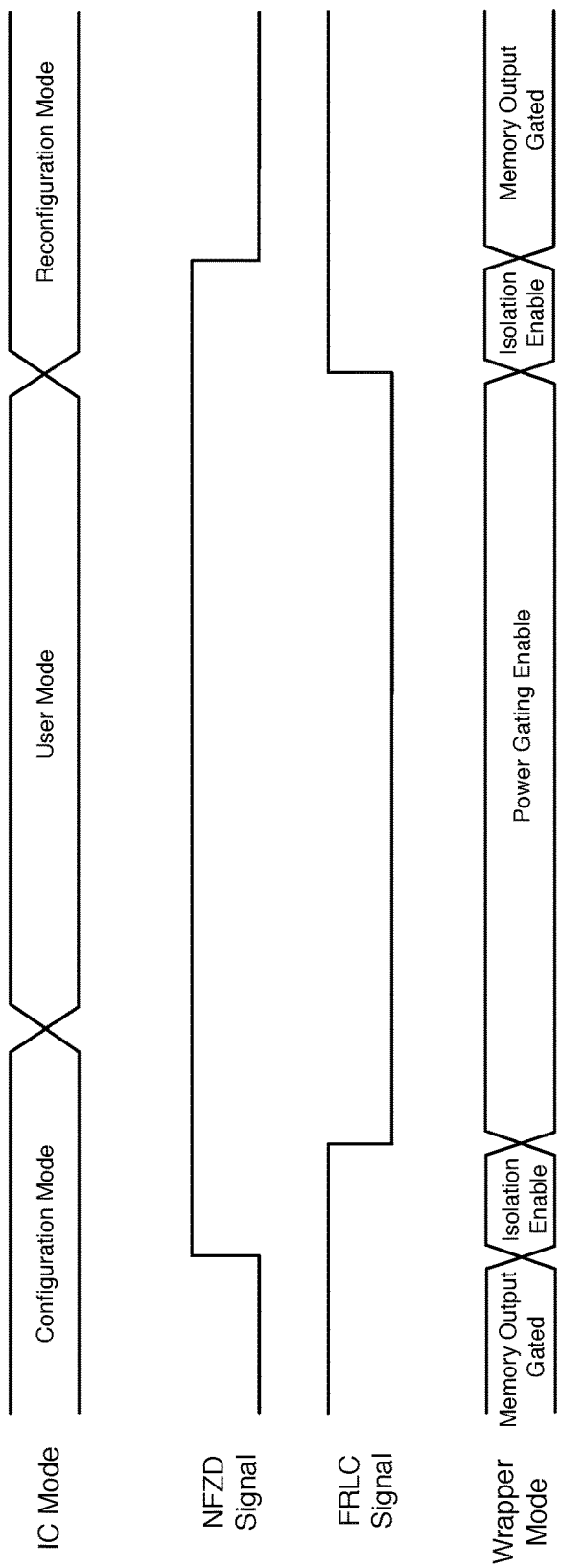
FIG. 3 shows examples of waveforms of a subset of the signals shown in FIG. 2 and various modes of operation, according to an embodiment.

FIG. 3 shows examples of waveforms of a subset of the signals shown in FIG. 2 and various modes of operation, according to an embodiment. The top waveform shown in FIG. 3 illustrates the mode of operation (IC mode) of the integrated circuit (IC) containing wrapper circuit 200 and circuit block 102. In the embodiment of FIG. 3, the IC is a programmable logic IC, such as a field programmable gate array (FPGA), a programmable logic device (PLD), or a programmable logic array (PLA).

FIG. 3 also illustrates exemplary waveforms for two freeze signals NFZD and FRLC that are provided to wrapper circuit 200 and shown in FIG. 2. The freeze signals are used to cause circuits in the IC to be inactive during a configuration mode of the IC. Referring to FIG. 2, freeze signal FRLC is provided to an inverting input of AND gate circuit 201, and freeze signal NFZD is provided to a non-inverting input of NAND gate circuit 203. The bottom waveform shown in FIG. 3 illustrates the mode of operation of wrapper circuit 200. According to various examples, the freeze signals FRLC and NFZD may be generated by circuitry in the core of the IC, in the periphery of the IC, or external to the IC.

As shown in FIG. 3, when the programmable logic IC is in configuration mode, freeze signal NFZD is in a logic low state, and freeze signal FRLC is in a logic high state. During the configuration mode, configuration memory circuits, including circuits 211-212, are loaded with configuration bits. The configuration bits are used to configure programmable circuits in the programmable logic IC to implement a user design for the IC. In response to signal NFZD being in a logic low state, NAND gate circuit 203 drives its output signal IOC to a logic high state. While signal NFZD is in a logic low state, the output signal M2 of storage circuit 212 via OR gate circuit 205 does not affect the output signal IOC of NAND gate circuit 203. Thus, the output signal of storage circuit 212 is prevented from affecting an input of AND logic gate circuit 202 when signal NFZD is a logic low.

In the embodiment of FIG. 2, circuit block 102 generates an output signal CBO. In response to the output signal IOC of NAND gate 203 being in a logic high state, AND gate circuit 202 provides the logic state of the output signal CBO of circuit block 102 to the output signal OUT of wrapper circuit 200. Thus, the output signal CBO of circuit block 102 is not gated by AND gate 202 while signal NFZD is a logic low. In some embodiments, signal CBO is only provided to other circuits in the IC that are outside wrapper circuit 200 via AND gate circuit 202 and signal OUT.

In response to the FRLC signal being in a logic high state, AND gate circuit 201 drives its output signal PGC to a logic low state, because signal FRLC is provided to an inverting input of AND gate circuit 201, as shown in FIG. 2. AND gate circuit 201 may, for example, have an inverter at its inverting input. While the FRLC signal is in a logic high state, the output signal M1 of storage circuit 211 via OR gate circuit 204 does not affect the output signal PGC of AND gate 201. Thus, the output signal of storage circuit 211 is prevented from affecting PFET 101 when signal FRLC is a logic high.

In response to the output signal PGC of AND gate circuit 201 being in a logic low state, PFET 101 is on, and current flows from the supply voltage node at supply voltage VCCL to a power input of circuit block 102 at voltage VDDG. When PFET 101 is on, voltage VDDG may be equal or substantially equal to supply voltage VCCL. Thus, circuit block 102 receives current from the supply voltage node at supply voltage VCCL via PFET 101 during configuration mode.

Prior to the end of configuration mode, freeze signal NFZD is driven to a logic high state, as shown in FIG. 3. In response to signal NFZD being in a logic high state, NAND gate circuit 203 does not block the output signal OR2 of OR gate circuit 205, and the isolation circuit in wrapper circuit 200 is enabled to block the output signal CBO of circuit block 102 based on the output signal OR2 of OR gate circuit 205.

Also, prior to the end of configuration mode, freeze signal FRLC is driven to a logic low state, as shown in FIG. 3. In response to signal FRLC being in a logic low state, AND gate circuit 201 does not block the output signal OR1 of OR gate circuit 204, and the power gating circuit in wrapper circuit 200 is enabled to block current from the supply voltage node at voltage VCCL from flowing to circuit block 102 through PFET 101.

After the freeze signal FRLC is driven to a logic low state, the programmable IC enters user mode as shown in FIG. 3. During the user mode, the IC is operated according to a user configuration of the programmable circuit blocks. If one or more of the circuit blocks in the IC are unused during user mode, power gating circuits may decouple the unused circuit blocks from the supply voltage VCCL to reduce power consumption, and isolation circuits may block (i.e., gate) the output signals of the unused circuit blocks from being provided to other circuitry in the IC.

For example, if circuit block 102 shown in FIG. 2 is not used during the user mode, the power gating circuit in wrapper circuit 200 may decouple circuit block 102 from the supply node at supply voltage VCCL, and the isolation circuit in wrapper circuit 200 may block the output signal CBO of circuit block 102 from affecting signal OUT. If circuit block 102 is unused during user mode, a 1 bit is stored in each of the storage circuits 211-212 during the configuration mode. When a 1 bit is stored in storage circuit 211, the output signal M1 of storage circuit 211 is in a logic high state, which causes OR gate circuit 204 to drive its output signal OR1 to a logic high state. In response to the output signal OR1 of OR gate circuit 204 being in a logic high state, and the FRLC signal being in a logic low state, AND gate circuit 201 drives its output signal PGC to a logic high state. In response to signal PGC being in a logic high state, PFET 101 is off, decoupling circuit block 102 from the supply node at supply voltage VCCL and blocking current from the supply node to circuit block 102. Thus, circuit block 102 is blocked from receiving current from supply voltage VCCL and consuming power if circuit block 102 is unused during user mode.

When a 1 bit is stored in storage circuit 212, the output signal M2 of storage circuit 212 is in a logic high state, which causes OR gate circuit 205 to drive its output signal OR2 to a logic high state. In response to signals OR2 and NFZD being in logic high states, NAND gate circuit 203 drives its output signal IOC to a logic low state. In response to signal IOC being in a logic low state, AND gate circuit 202 maintains its output signal OUT in a logic low state, regardless of the logic state of signal CBO. AND gate circuit 202 prevents rising and falling edges in the output signal CBO of circuit block 102 from propagating to output signal OUT when signal IOC is in a logic low state, effectively gating the output signal CBO. As a result, variations in the output signal CBO of circuit block 102 do not affect other circuitry in the IC while circuit block 102 is unused, and the power consumption of the IC may be further reduced. Thus, the isolation circuit gates the output signal CBO of circuit block 102 if circuit block 102 is unused during user mode.

As shown in FIG. 2, a dynamic power gating signal DPRG is provided to an additional input of OR gate circuit 204, and a dynamic isolation signal DPIS is provided to an additional input of OR gate circuit 205. Signals DPRG and DPIS may be generated in the same IC as wrapper circuit 200, for example, by circuitry implementing a user design for the IC, or may be provided from outside the IC. Signals DPRG and DPIS provide dynamic power gating and dynamic isolation, respectively, to circuit block 102. The dynamic power gating and dynamic isolation features provided by signals DPRG and DPIS may be used, for example, if 0 bits are stored in storage circuits 211-212. 0 bits may be stored in storage circuits 211-212 during configuration mode if circuit block 102 is intended to be used for at least part of the user mode by a user design for the IC. A user design for a programmable IC may use some of the circuit blocks, such as circuit block 102, for only part of the user mode. Signals DPRG and DPIS may be asserted to logic high states to enable dynamic power gating and dynamic isolation of circuit block 102 during a portion of the user mode that circuit block 102 is unused or idle, bypassing and overriding the 0 bits stored in storage circuits 211-212.

When circuit block 102 is not used during a portion of the user mode, signal DPRG is driven to a logic high state to block current from supply voltage VCCL to circuit block 102. In response to signal DPRG being in a logic high state, the output signal OR1 of OR gate circuit 204 is in a logic high state regardless of the value of the bit stored in storage circuit 211, and the output signal PGC of AND gate circuit 201 is also in a logic high state when the FRLC signal is in a logic low state during user mode. PFET 101 is off in response to signal PGC being in a logic high state, blocking current from the supply node at supply voltage VCCL to circuit block 102. Because circuit block 102 does not receive current from the supply node at supply voltage VCCL when PFET 101 is off, circuit block 102 consumes less power during the portion of the user mode that the circuit block 102 is unused.

When circuit block 102 is not used during a portion of the user mode, signal DPIS is driven to a logic high state to block the output signal CBO of circuit block 102 from propagating to the output signal OUT of wrapper circuit 200. In response to signal DPIS being in a logic high state, the output signal OR2 of OR gate circuit 205 is in a logic high state regardless of the value of the bit stored in storage circuit 212, and the output signal IOC of NAND gate circuit 203 is in a logic low state in response to both of its input signals NFZD and OR2 being in logic high states. In response to the output signal IOC of NAND gate 203 being in a logic low state, AND gate circuit 202 maintains its output signal OUT in a logic low state, blocking the output signal CBO from affecting output signal OUT. As a result, variations in the output signal CBO of circuit block 102 do not affect other circuitry in the IC while circuit block 102 is unused, and the power consumption of the IC may be further reduced. Thus, the isolation circuit in wrapper circuit 200 gates the output signal CBO of circuit block 102 during the portion of the user mode during which circuit block 102 is unused.

When circuit block 102 is used during a portion of the user mode, signals DPRG and DPIS are driven to logic low states. When signals DPRG and DPIS are in logic low states, PFET 101 and the AND gate circuit 202 are controlled by the bits stored in storage circuits 211-212, respectively. Thus, if 0 bits are stored in storage circuits 211-212 indicating that circuit block 102 is intended to be used during a portion of the user mode, signals DPRG and DPIS are driven to logic low states during the portion of the user mode during which circuit block 102 is intended to be used. While signals DPRG and DPIS are in logic low states, the output signals OR1-OR2 of OR gates 204-205 are in logic low states, causing PFET 101 to be on and causing AND gate circuit 202 to allow signal CBO to propagate to signal OUT during the user mode.

As shown in FIG. 2, a no isolation signal NOIS may be provided to a control input of circuit block 102. The NOIS signal may be asserted to deactivate the isolation circuit in wrapper circuit 200 when the output signal CBO of circuit block 102 does not need to be isolated. Wrapper circuit 200 may, for example, provide an alternate path for the output signal CBO to propagate to other circuitry in the IC in response to signal NOIS being asserted.

After the user mode, the programmable IC may be reconfigured in a reconfiguration mode, as shown in FIG. 3. During the reconfiguration mode, configuration memory circuits, including circuits 211-212, are loaded with new configuration bits that reconfigure the programmable logic circuits in the IC according to a modified user design. Before the reconfiguration mode, the FRLC signal is driven back to a logic high state to turn on PFET 101 to disable power gating of circuit block 102. The isolation of the output signal CBO of circuit block 102 is still enabled immediately after the rising edge in signal FRLC as shown in FIG. 3. Subsequently, the NFZD signal is driven back to a logic low state to disable isolation of circuit block 102. The output signals M1-M2 of storage circuits 211-212 are then gated again by AND gate 201 and NAND gate 203, respectively, as discussed above with respect to configuration mode.

Figure 4:
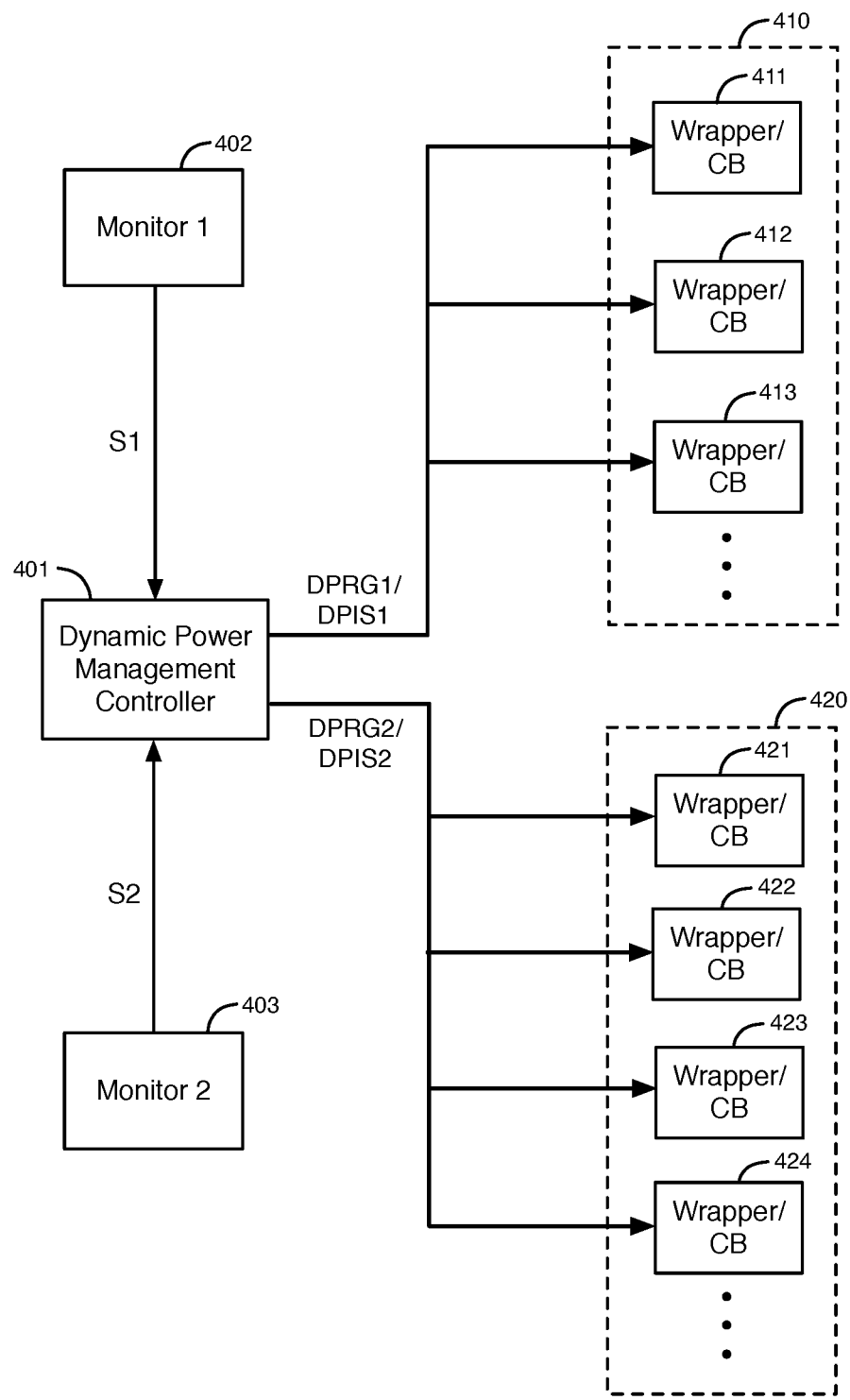
FIG. 4 illustrates an example of control circuitry for controlling dynamic power gating and dynamic isolation of circuit blocks in an integrated circuit (IC), according to an embodiment.

FIG. 4 illustrates an example of control circuitry for controlling dynamic power gating and dynamic isolation of circuit blocks in an integrated circuit (IC), according to an embodiment. The control circuitry of FIG. 4 includes dynamic power management controller circuit 401 and monitor circuits 402-403. FIG. 4 also illustrates two groups 410 and 420 of wrapper circuits and circuit blocks. Power management controller circuit 401 controls the dynamic power gating and the dynamic isolation provided by the wrapper circuits coupled to the circuit blocks in groups 410 and 420.

Dynamic power management controller circuit 401 generates a first dynamic power gating signal DPRG1 and a first dynamic isolation signal DPIS1 for controlling the dynamic power gating and the dynamic isolation provided by the power gating and isolation circuits, respectively, that are coupled to circuit blocks in group 410 of circuit blocks. Group 410 may have any number of circuit blocks, including for example, the circuit blocks and associated wrapper circuits 411-413. Signals DPRG1 and DPIS1 are provided to each of the wrapper circuits 200 that are coupled to each of the circuit blocks 102 in group 410. Signals DPRG1 and DPIS1 can be toggled to provide dynamic power gating and dynamic isolation to each of the circuit blocks in group 410, as described above with respect to FIGS. 2-3. Signals DPRG1 and DPIS1 can be toggled to enable and disable dynamic power gating and dynamic isolation for one, a subset of, or all of the circuit blocks in group 410 at the same time.

In other embodiments, dynamic power management controller 401 may generate multiple dynamic power gating control signals that independently control dynamic power gating in different ones of the circuit blocks in group 410 or in different subsets of the circuit blocks in group 410. Dynamic power management controller 401 may also generate multiple dynamic isolation control signals that independently control dynamic isolation in different ones of the circuit blocks in group 410 or in different subsets of the circuit blocks in group 410. Thus, dynamic power management controller 401 may generate one dynamic power gating control signal and one dynamic isolation control signal for each individual circuit block or for each subset of circuit blocks.

Dynamic power management controller 401 also generates a second dynamic power gating signal DPRG2 and a second dynamic isolation signal DPIS2 for controlling the dynamic power gating and the dynamic isolation provided by the power gating and isolation circuits, respectively, that are coupled to the circuit blocks in group 420 of circuit blocks. Group 420 may have any number of circuit blocks, including for example, circuit blocks and associated wrapper circuits 421-424. Signals DPRG2 and DPIS2 are provided to each of the wrapper circuits 200 that are coupled to each of the circuit blocks 102 in group 420. Signals DPRG2 and DPIS2 can be toggled to provide dynamic power gating and dynamic isolation to the circuit blocks in group 420, as described above with respect to FIGS. 2-3. Signals DPRG2 and DPIS2 can be toggled to enable and disable dynamic power gating and dynamic isolation for one, a subset of, or all of the circuit blocks in group 420 at the same time.

In other embodiments, dynamic power management controller 401 may generate multiple dynamic power gating control signals for independently controlling dynamic power gating in different ones of the circuit blocks in group 420 or in different subsets of the circuit blocks in group 420. Dynamic power management controller 401 may also generate multiple dynamic isolation control signals that independently control dynamic isolation in different ones of the circuit blocks in group 420 or in different subsets of the circuit blocks in group 420.

Monitor circuits 402-403 monitor events associated with the circuit blocks in groups 410 and 420, respectively. Monitor circuits 402-403 generate control signals S1-S2, respectively, that are provided to inputs of dynamic power management controller circuit 401 to indicate these events. The dynamic power management controller 401 responds to these events as indicated by signals S1-S2 by power gating and/or isolating the circuit blocks in groups 410 and 420 using signals DPRG1, DPIS1, DPRG2, DPIS2, and other control signals in some embodiments, as described above.

The monitor circuits 402-403 may be, for example, sensor circuits, data traffic monitoring circuits, or event counter circuits that enable controller circuit 401 to monitor the application usages of the groups 410 and 420 of circuit blocks. As an example, monitor circuits 402-403 may monitor data traffic into and/or out of the circuit blocks in groups 410 and 420, respectively. During off-peak hours of slow data traffic, controller circuit 401 may power down some or all of the circuit blocks in groups 410 and 420 when the corresponding circuit blocks are not being used as indicated by the output signals S1-S2 of monitor circuits 402-403. The remaining data traffic during off-peak hours may be channeled to the remaining circuit blocks in groups 410 and 420 or to other circuit blocks in the IC. As another example, monitor circuits 402-403 may monitor temperature and cause circuit blocks to power down at high temperature. As yet another example, monitor circuits 402-403 may count events using counter circuits and may cause circuit blocks to power down after a predefined number of events. As still another example, monitor circuits 402-403 may monitor system level events and may cause circuit blocks to power down based on predefined system level events.

Figure 5:
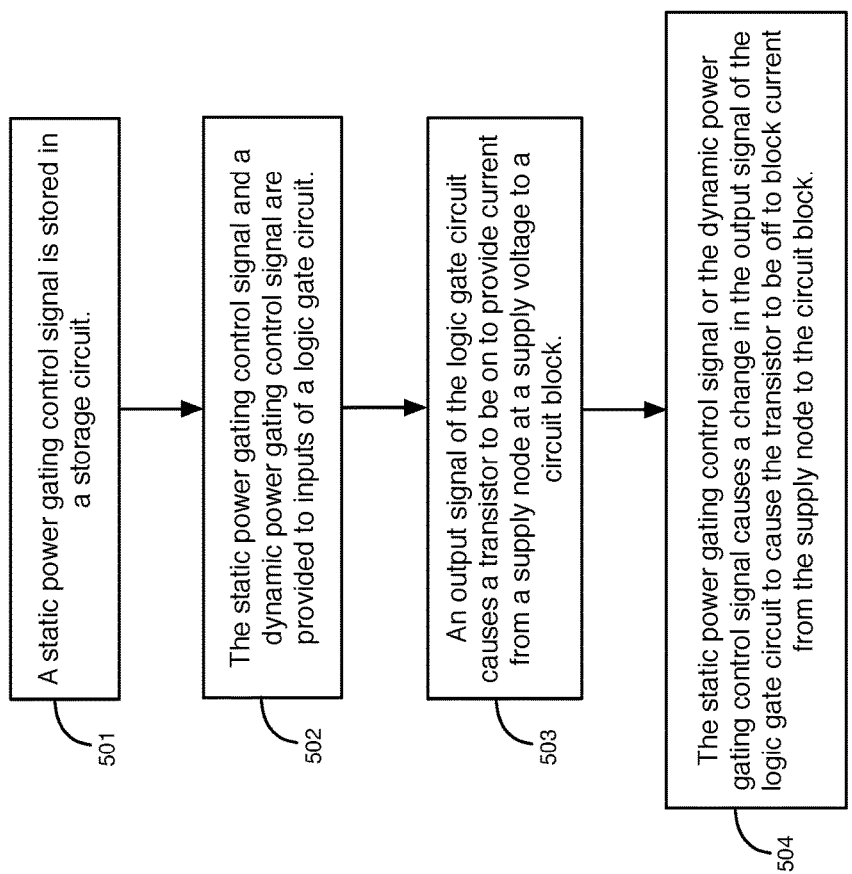
FIG. 5 illustrates examples of operations that may be performed to implement power gating of a circuit block, according to an embodiment.

FIG. 5 illustrates examples of operations that may be performed to implement power gating of a circuit block, according to an embodiment. In operation 501, a static power gating control signal is stored in a storage circuit. In operation 502, the static power gating control signal and a dynamic power gating control signal are provided to inputs of a logic gate circuit. In operation 503, an output signal of the logic gate circuit causes a transistor to be on to provide current from a supply node at a supply voltage to a circuit block. The transistor is coupled between the circuit block and the supply node. In operation 504, the static power gating control signal or the dynamic power gating control signal causes a change in the output signal of the logic gate circuit to cause the transistor to be off to block current from the supply node to the circuit block.

The methods and apparatuses described herein may be incorporated into any suitable electronic device or system of electronic devices. For example, the methods and apparatuses may be incorporated into numerous types of devices, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits described herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
a circuit block;
a first storage circuit to store a static power gating control signal;
a first logic gate circuit to receive a dynamic power gating control signal and the static power gating control signal from the first storage circuit;
a transistor coupled between the circuit block and a supply node at a supply voltage, wherein a conductive state of the transistor is determined by an output signal of the first logic gate circuit, and wherein the transistor is turned off to provide power gating to the circuit block in response to a change in the output signal of the first logic gate circuit that is caused by the static power gating control signal or the dynamic power gating control signal;
a second storage circuit to store a static isolation control signal;
a second logic gate circuit to receive a dynamic isolation control signal and the static isolation control signal from the second storage circuit; and
a third logic gate circuit to receive an output signal of the circuit block and a signal that is based on an output signal of the second logic gate circuit, wherein the third logic gate circuit prevents the output signal of the circuit block from propagating to other circuits in the integrated circuit in response to a change in the output signal of the second logic gate circuit that is caused by either one of the static isolation control signal or the dynamic isolation control signal.

2. The integrated circuit of claim 1,
wherein the third logic gate circuit performs an AND logic function on the output signal of the circuit block and the signal that is based on the output signal of the second logic gate circuit.

3. The integrated circuit of claim 1, wherein the dynamic power gating control signal is adjustable by a user of the integrated circuit to turn off the transistor to provide dynamic power gating to the circuit block, and wherein the dynamic isolation control signal is adjustable by the user to prevent the output signal of the circuit block from propagating to the other circuits.

4. The integrated circuit of claim 1 further comprising:
a fourth logic gate circuit to receive the output signal of the first logic gate circuit and a first freeze control signal, wherein an output of the fourth logic gate circuit is coupled to a control input of the transistor; and a fifth logic gate circuit to receive the output signal of the second logic gate circuit and a second freeze control signal, wherein an output of the fifth logic gate circuit is coupled to an input of the third logic gate circuit.

5. The integrated circuit of claim 4, wherein the first and second freeze control signals cause the fourth and fifth logic gate circuits to disable power gating and isolation, respectively, of the circuit block during a configuration mode of the integrated circuit, and wherein the integrated circuit is a programmable logic integrated circuit.

6. The integrated circuit of claim 1, wherein the circuit block is a digital signal processing circuit that is configurable to perform arithmetic functions.

7. The integrated circuit of claim 1, wherein the transistor is a p-channel field-effect transistor.

8. The integrated circuit of claim 1 further comprising:
a dynamic power management controller circuit to generate the dynamic power gating control signal; and
a monitor circuit to generate a monitor control signal to cause the dynamic power management controller circuit to adjust the dynamic power gating control signal to turn off the transistor to provide power gating to the circuit block in response to the monitor circuit detecting a predefined event in the integrated circuit.

9. The integrated circuit of claim 8, wherein the monitor circuit monitors a temperature of the integrated circuit, data traffic to and from the circuit block, a system event in the integrated circuit, or a number of events to generate the monitor control signal.

10. An integrated circuit comprising:
a circuit block;
a storage circuit that stores a static isolation control signal;
a first logic gate circuit that receives a dynamic isolation control signal and the static isolation control signal from the storage circuit; and
a second logic gate circuit that receives an output signal of the circuit block and a signal that is based on an output signal of the first logic gate circuit, wherein the second logic gate circuit prevents the output signal of the circuit block from propagating to other circuits in the integrated circuit in response to a change in the output signal of the first logic gate circuit that is caused by a change in either one of the static isolation control signal or the dynamic isolation control signal.

11. The integrated circuit of claim 10 further comprising:
a third logic gate circuit that receives the output signal of the first logic gate circuit and a freeze control signal, wherein an output of the third logic gate circuit is coupled to an input of the second logic gate circuit, and wherein the third logic gate circuit disables isolation of the output signal of the circuit block during a configuration mode of the integrated circuit in response to the freeze control signal, and wherein the integrated circuit is a programmable logic integrated circuit.

12. The integrated circuit of claim 10 further comprising:
a dynamic power management controller circuit that generates the dynamic isolation control signal; and
a monitor circuit that generates a monitor control signal to cause the dynamic power management controller circuit to adjust the dynamic isolation control signal to prevent the output signal of the circuit block from propagating to the other circuits in response to the monitor circuit detecting a predefined event in the integrated circuit.

13. The integrated circuit of claim 12, wherein the monitor circuit monitors a temperature of the integrated circuit, data traffic to and from the circuit block, a system event in the integrated circuit, or a number of events to generate the monitor control signal.

14. The integrated circuit of claim 10 further comprising:
a third logic gate circuit that receives a static power gating control signal and a dynamic power gating control signal; and
a transistor coupled between the circuit block and a supply node at a supply voltage, wherein a conductive state of the transistor is determined based on an output signal of the third logic gate circuit, and wherein the transistor is turned off to provide power gating to the circuit block in response to a change in the static power gating control signal or in the dynamic power gating control signal.

15. The integrated circuit of claim 14 further comprising:
a fourth logic gate circuit that receives the output signal of the third logic gate circuit and a freeze control signal, wherein an output of the fourth logic gate circuit is coupled to a control input of the transistor, wherein the fourth logic gate circuit disables power gating of the circuit block during a configuration mode of the integrated circuit in response to the freeze control signal, and wherein the integrated circuit is a programmable logic integrated circuit.

16. A method comprising:
storing a static power gating control signal in a first storage circuit;
receiving the static power gating control signal and a dynamic power gating control signal at inputs of a first logic gate circuit;
causing a transistor to be on based on an output signal of the first logic gate circuit to provide current from a supply node at a supply voltage to a circuit block, wherein the transistor is coupled between the circuit block and the supply node; and
causing the transistor to be off to block current from the supply node to the circuit block in response to a change in the output signal of the first logic gate circuit that is caused by the static power gating control signal or the dynamic power gating control signal;
storing a static isolation control signal in a second storage circuit;
receiving the static isolation control signal and a dynamic isolation control signal at inputs of a second logic gate circuit;
receiving an output signal of the circuit block and a signal that is based on an output signal of the second logic gate circuit at inputs of a third logic gate circuit; and
preventing the output signal of the circuit block from propagating to other circuits in response to a change in either one of the static isolation control signal or the dynamic isolation control signal using the third logic gate circuit.

17. The method of claim 16,
wherein the third logic gate circuit performs an AND logic function on the output signal of the circuit block and the signal that is based on the output signal of the second logic gate circuit.

18. The method of claim 16 further comprising:
receiving the output signal of the first logic gate circuit and a first freeze control signal at inputs of a fourth logic gate circuit, wherein an output of the fourth logic gate circuit is coupled to a control input of the transistor; and receiving the output signal of the second logic gate circuit and a second freeze control signal at inputs of a fifth logic gate circuit, wherein an output of the fifth logic gate circuit is coupled to an input of the third logic gate circuit, and wherein the first and second freeze control signals cause the fourth and fifth logic gate circuits to disable power gating and isolation, respectively, of the circuit block during a configuration mode of an integrated circuit that comprises the circuit block.

19. The method of claim 16 further comprising:

monitoring events in an integrated circuit that comprises the circuit block to generate a monitor control signal using a monitor circuit; and adjusting the dynamic power gating control signal using a dynamic power management controller circuit to turn off the transistor to block current from the supply node to the circuit block in response to the monitor circuit adjusting the monitor control signal after detecting a predefined event.

20. The method of claim 19, wherein monitoring events in the integrated circuit further comprises monitoring a temperature, data traffic to and from the circuit block, or a number of events using the monitor circuit to generate the monitor control signal.

* * * * *